United States Patent
Behles

(10) Patent No.: US 9,131,039 B2
(45) Date of Patent: Sep. 8, 2015

(54) PIEZOELECTRIC ACTUATOR INTERFACE AND METHOD

(75) Inventor: Thorsten Behles, Kangasala (FI)

(73) Assignee: Nokia Technologies Oy, Espoo (FI)

( * ) Notice: Subject to any disclaimer, the term of this patent is extended or adjusted under 35 U.S.C. 154(b) by 40 days.

(21) Appl. No.: 13/334,924

(22) Filed: Dec. 22, 2011

(65) Prior Publication Data

US 2013/0162543 A1    Jun. 27, 2013

(51) Int. Cl.
| | |
|---|---|
| *G06F 3/0488* | (2013.01) |
| *H04M 1/02* | (2006.01) |
| *H01L 29/10* | (2006.01) |
| *H01L 41/047* | (2006.01) |
| *H01L 41/09* | (2006.01) |
| *H05K 1/18* | (2006.01) |
| *G06F 3/01* | (2006.01) |
| *G06F 3/041* | (2006.01) |
| *H05K 3/00* | (2006.01) |
| *H05K 3/32* | (2006.01) |

(52) U.S. Cl.
CPC .............. *H04M 1/0266* (2013.01); *G06F 3/016* (2013.01); *H01L 29/10* (2013.01); *H01L 41/0475* (2013.01); *H01L 41/094* (2013.01); *H05K 1/189* (2013.01); *G06F 3/041* (2013.01); *H04M 2250/22* (2013.01); *H05K 3/0061* (2013.01); *H05K 3/323* (2013.01); *H05K 2201/10083* (2013.01); *Y10T 29/4913* (2015.01)

(58) Field of Classification Search
CPC .......... G08B 6/00; G08B 3/10; H01L 41/053; H01L 29/10; H01L 41/187; G06F 3/041; H04R 17/00; H04R 25/00
See application file for complete search history.

(56) References Cited

U.S. PATENT DOCUMENTS

| | | | |
|---|---|---|---|
| 5,339,364 A * | 8/1994 | Lenain et al. | 381/173 |
| 7,581,296 B2 * | 9/2009 | Yetter et al. | 29/25.35 |
| 7,869,589 B2 * | 1/2011 | Tuovinen | 379/433.07 |
| 8,384,679 B2 * | 2/2013 | Paleczny et al. | 345/173 |
| 2005/0054390 A1* | 3/2005 | Tuovinen | 455/575.1 |
| 2005/0057330 A1* | 3/2005 | Belanger et al. | 335/78 |
| 2006/0158068 A1* | 7/2006 | Shimizu et al. | 310/358 |
| 2006/0232171 A1* | 10/2006 | Tietze | 310/365 |
| 2008/0143216 A1* | 6/2008 | Berkcan et al. | 310/346 |
| 2010/0225600 A1* | 9/2010 | Dai et al. | 345/173 |
| 2011/0080347 A1* | 4/2011 | Steeves et al. | 345/173 |
| 2011/0134059 A1* | 6/2011 | Paleczny et al. | 345/173 |
| 2012/0068957 A1* | 3/2012 | Puskarich et al. | 345/174 |

OTHER PUBLICATIONS

Photograph 1 of components in Blackberry Storm 2, 2009.
Photograph 2 of assembly having metal carrier, FR4 substrate, ceramic peizo and individual electrical wires solder to conductors on FR4 substrate, publically known before Dec. 22, 2010.
Photograph 3 of disassembled components of assembly shown in Photograph 2, publicallyknown before Dec. 22, 2010.

* cited by examiner

Primary Examiner — Kent Chang
Assistant Examiner — Sujit Shah
(74) Attorney, Agent, or Firm — Harrington & Smith

(57) ABSTRACT

An apparatus including a flexible circuit having a flexible substrate and at least one electrical conductor; and a least one piezoelectric member adapted to move when a voltage is applied to the piezoelectric member. The piezoelectric member is mounted to a first side of the flexible substrate and electrically connected to at least one of the electrical conductors.

21 Claims, 8 Drawing Sheets

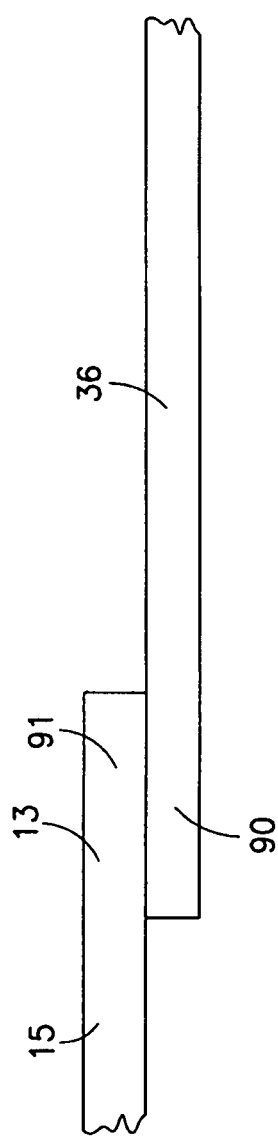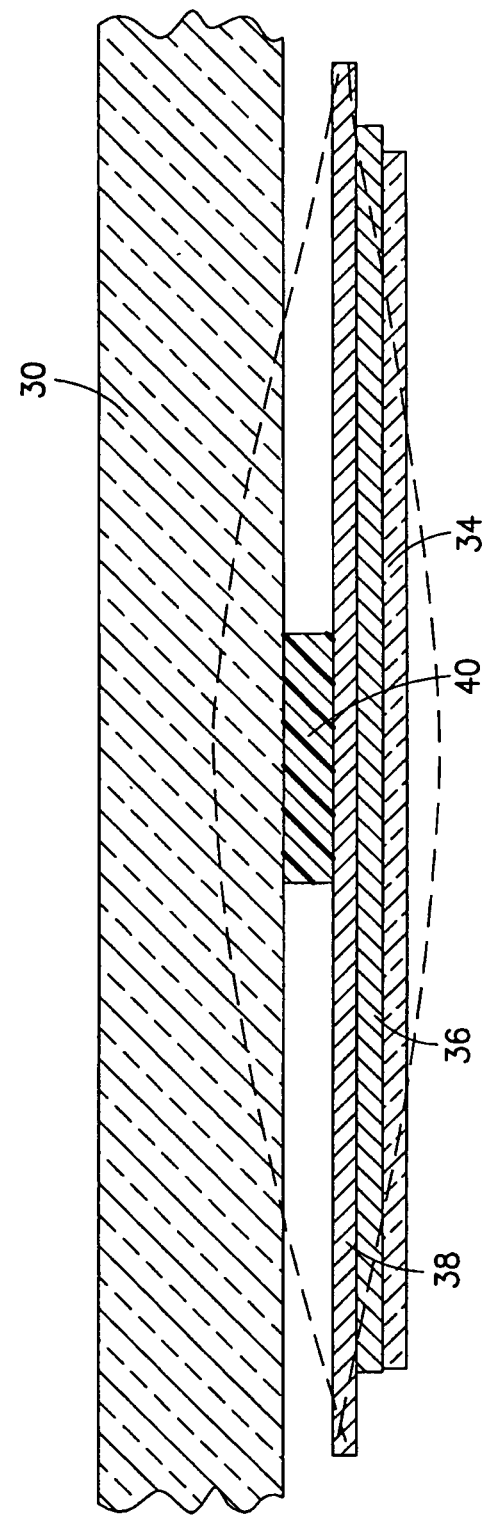

PIEZOELECTRIC ACTUATOR INTERFACE AND METHOD

BACKGROUND

1. Technical Field

The exemplary and non-limiting embodiments relate generally to a piezoelectric actuator and methods and, more particularly, to a piezoelectric actuator with a flexible circuit.

2. Brief Description of Prior Developments

For touch screen devices with a localized user interface (UI) feedback or a Tactile Audio Display, piezo bending actuators are usually used to generate the localized feedback on the UI or to generate sound.

SUMMARY

The following summary is merely intended to be exemplary. The summary is not intended to limit the scope of the claims.

In accordance with one aspect, an apparatus is provided comprising an interface circuit comprising a substrate and a plurality of electrical conductors; and at least one piezoelectric member adapted to move when a voltage is applied to the piezoelectric member. The piezoelectric member is mounted to a first side of the substrate. Each of the electrical conductors has a first end and a second end. The first ends are connected to the at least one piezoelectric member directly between the substrate and the at least one piezoelectric member. The electrical conductors extend away from the at least one piezoelectric member such that the second ends of the electrical conductors are spaced a substantial distance away from the at least one piezoelectric member for connection to another component.

In accordance with another aspect, an apparatus is provided comprising an electrical display; and a user feedback system located beneath the electrical display. The user feedback system comprises at least one piezoelectric member connected to a flexible circuit. The flexible circuit comprises a flexible polymer substrate and electrical conductors on the flexible polymer substrate. The at least one piezoelectric member is sandwiched between the flexible circuit and the electrical display.

In accordance with another aspect, a method comprises mounting a side of a piezoelectric member to a side of a flexible circuit, where the flexible circuit comprises a substrate and electrical conductors, where the substrate comprises a flexible polymer material; and electrically connecting the electrical conductors of the flexible circuit to the piezoelectric member at different locations along the flexible circuit and the piezoelectric member.

In accordance with another aspect, a method comprises supplying a voltage to a piezoelectric member from a flexible circuit, where the flexible circuit comprises an electrical insulating flexible substrate and electrical conductors, where the substrate comprises a flexible polymer material, and where the piezoelectric member is mounted to a side of the flexible substrate with contact pads of the electrical conductors being sandwiched between portions of the flexible polymer material and the piezoelectric member; and moving the flexible circuit with the piezoelectric member along a length of the piezoelectric member as the piezoelectric member is moved by the voltage.

BRIEF DESCRIPTION OF THE DRAWINGS

The foregoing aspects and other features are explained in the following description, taken in connection with the accompanying drawings, wherein:

FIG. 11 is a diagram illustrating connection of an end of the flexible circuit to a main circuit board of the apparatus shown in FIGS. 1 and 2; and FIG. 12 is schematic cross sectional view of the assembly similar to FIG. 5 on the electrical display, but in a different assembly organization.

DETAILED DESCRIPTION OF EMBODIMENTS

Figure 1:
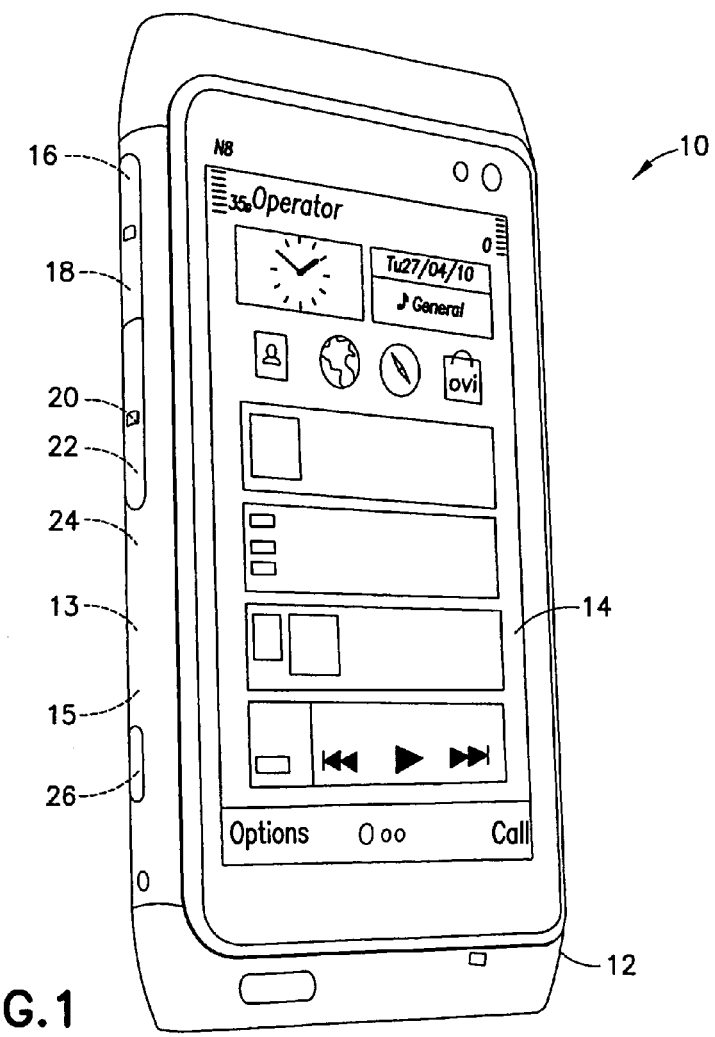
FIG. 1 is a perspective view of an example embodiment.

Referring to FIG. 1, there is shown a perspective view of an apparatus 10 according to an example embodiment. In this example the apparatus 10 is a hand-held portable apparatus comprising various features including a telephone application, Internet browser application, camera application, video recorder application, music player and recorder application, email application, navigation application, gaming application, and/or any other suitable electronic device application. The apparatus may be any suitable portable electronic device, such as a mobile phone, computer, laptop, PDA, etc.

The apparatus 10, in this example embodiment, comprises a housing 12, a touch screen 14 which functions as both a display and a user input, and electronic circuitry 13 including a printed wiring board 15 having at least some of the electronic circuitry thereon. The electronic circuitry can include, for example, a receiver 16, a transmitter 18, and a controller 20. The controller 20 may include at least one processor 22, at least one memory 24, and software. A rechargeable battery 26 is also provided.

Figure 2:
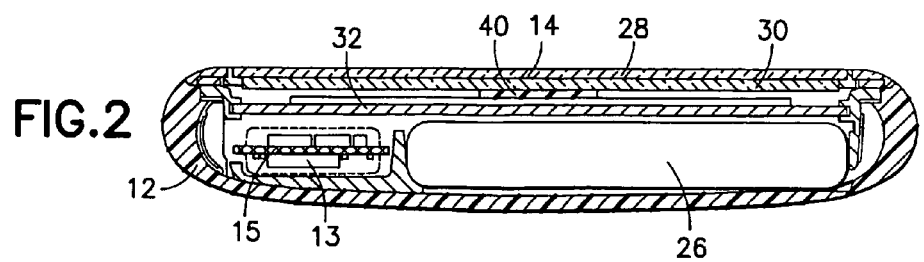
FIG. 2 is a cross sectional view of the apparatus shown in FIG. 1.

Referring also to FIG. 2, the touch screen 14 comprises a front window 28 and an electrical display 30, such as a thin film transistor liquid crystal display (TFT-LCD) or an organic light-emitting diode (OLED) display for example. As noted above, the display 14 in this example is a touch screen display which functions as both a display screen and as a user input. A display screen section of the display 14 is connected to a display driver of the circuitry 13. A touch screen section of the display 14 is connected to a touch screen controller of the circuitry 13. The display drivers and touch screen controllers are connected to the controller 20.

The apparatus 10 also includes a user feedback system which includes a piezoelectric actuator assembly 32. Referring also to FIGS. 3-6, the assembly 32 in this example comprises piezoelectric members 34, a flexible circuit 36, metal carriers 38, and foam cushions 40. In one type of alternate example, the apparatus 10 could be provided with more than one assembly 32. This example embodiment shows the assembly 32 with two of the piezoelectric members 34. However, in an alternate example, more or less than two piezoelectric members 34 could be provided. The piezoelectric members 34 each comprise a ceramic member which is adapted to move when a voltage is applied. In this example the piezoelectric members 34 have a general flat rectangular shape.

Figure 3:
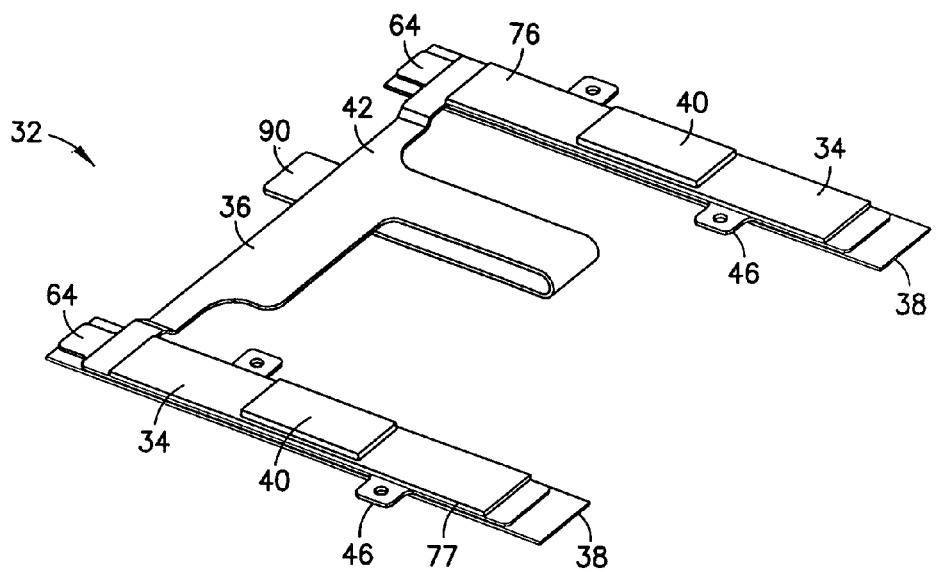
FIG. 3 is a perspective view of an assembly used in the apparatus shown in FIG. 1.
Figure 4:
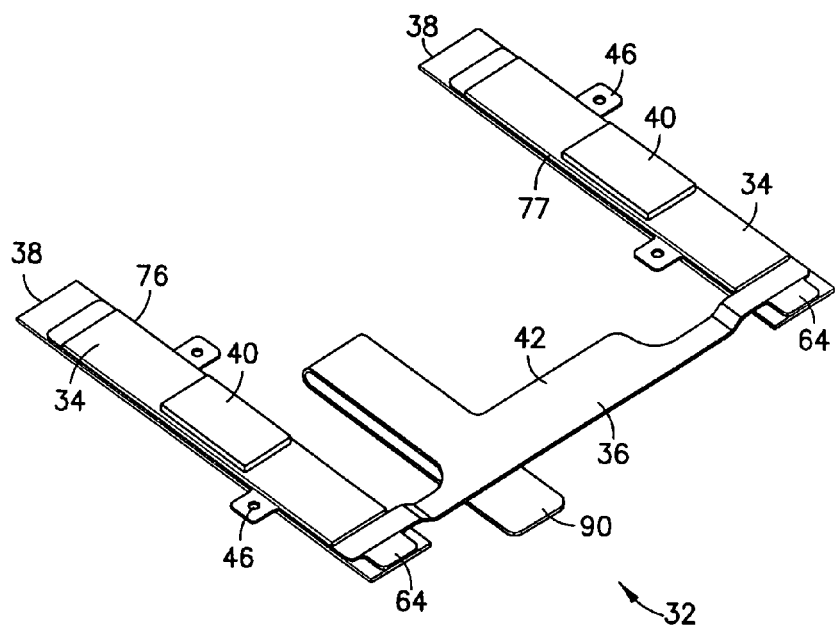
FIG. 4 is a perspective view of the assembly shown in FIG. 3 from another direction.
Figure 7:
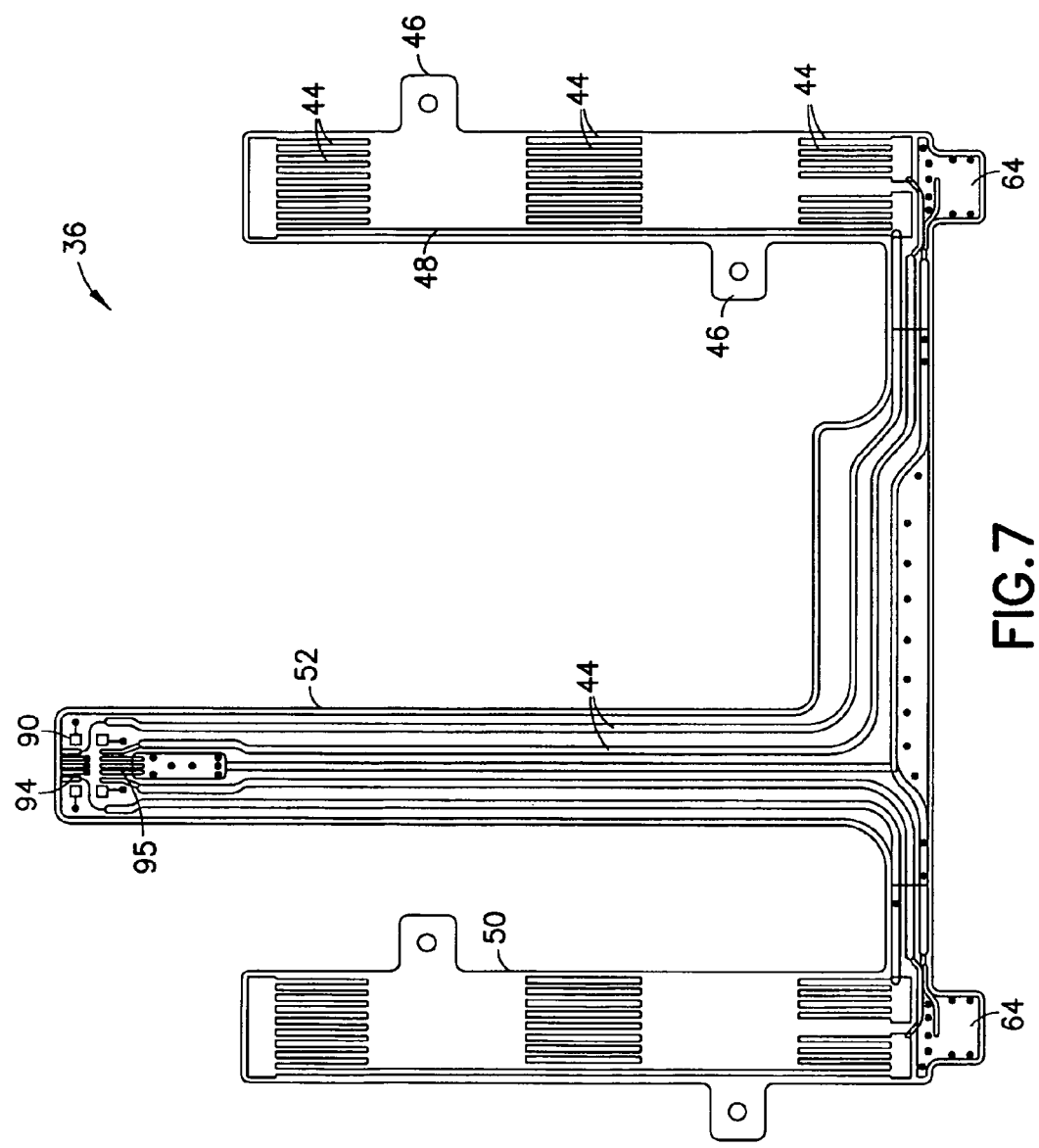
FIG. 7 is a top plan view of flexible circuit shown in FIG. 3.
Figure 8:
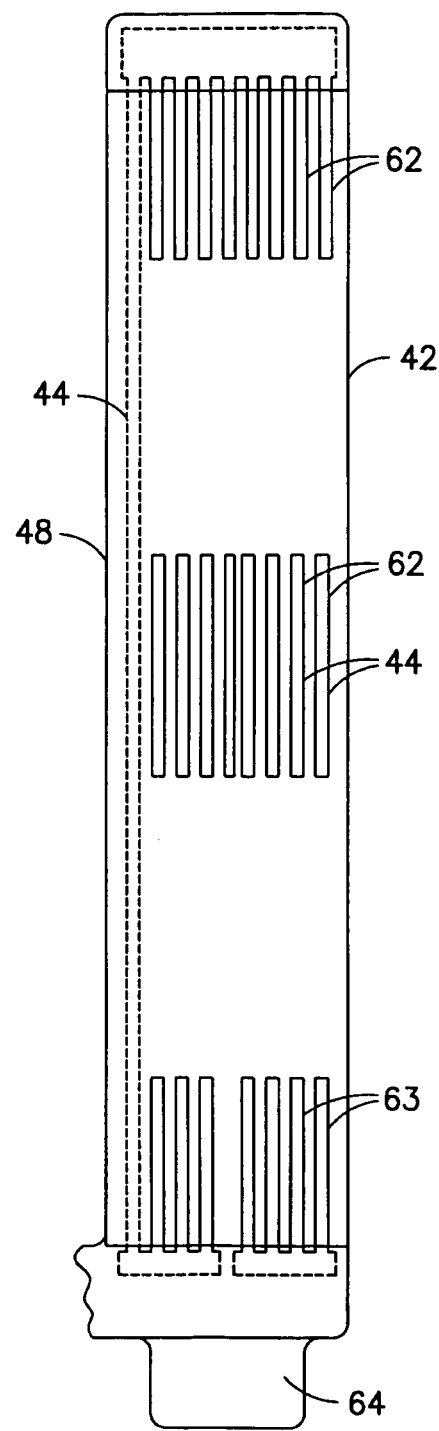
FIG. 8 is an enlarged top plan view of one section of the flexible circuit shown in FIG. 7.

Referring also to FIGS. 7-8, the flexible circuit (or flex circuit) 36 has a substrate or base 42 and electrical conductors 44. In this example the conductors 44 are mostly contained or insulated inside the substrate except a contact pads as described below. The substrate 42 is comprised of a flexible polymer material. The conductors can comprise, for example, metal foil. The flexible circuit 36 can comprise multiple layers of conductors separated by layers of the substrate, such as a laminate. One of the layers could be a ground layer. FIGS. 3-4 and 7 show the flexible circuit 36 with tabs 46. These tabs 46 are merely used as a guiding feature for assembling the assembly 32 and can be removed after the assembly 32 is formed. In the example shown, the flexible circuit 36 has a first section 48, a second section 50 and a third section 52. However, in alternate embodiments more or less than three sections could be provided.

As illustrated from the example shown in FIGS. 3-4, the flexible nature of the flexible circuit 36 allows the third section 52 to bend, and be located out of the plane of the first and second sections 48, 52. This allows the connection to another member at end 90 of the third section 52 to be moved away from the moving components of the assembly 32, and the connection of the conductors 44 to the piezoelectric members 34 can be moved away from any possible contact with the bottom side 92 of the display 30.

Figure 6:
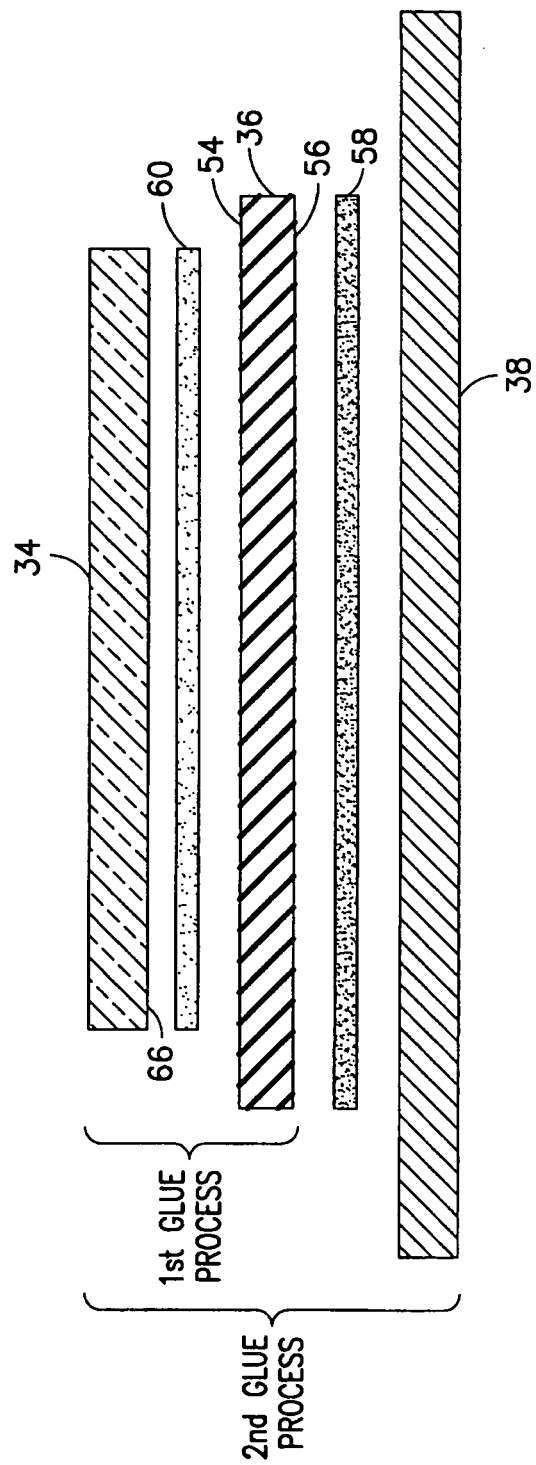
FIG. 6 is an exploded view of components of the assembly shown in FIG. 3.

The first and second sections 48, 50 form mounting areas where the piezoelectric members 34 are mounted. The first and second sections 48, 50 also form mounting areas where the metal carriers 38 are mounted. Referring particularly to FIG. 6, the piezoelectric members 34 are mounted to a first side 54 of the first and second sections 48, 50. The metal carriers 38 are mounted to an opposite second side 56 of the first and second sections 48, 50. In this example, an adhesive 58, such as epoxy glue, is used to mount the flexible circuit and metal carriers 38 together. An electrically conductive adhesive 60, such as anisotropic conductive adhesives (ACA) (e.g., Anisotropic conductive film (ACF) or anisotropic conductive paste (ACP)) for example, is used to mount the flexible circuit 36 and the piezoelectric member 34 together. Thus, the first and second sections 48, 50 of the flexible circuit 36 are sandwiched between one of the piezoelectric members 34 and one of the metal carriers 38.

Referring particularly to FIGS. 6 and 8, the top side of the first and second sections 48, 50 comprises contact pads 62, 63 of the conductors 44. These contact pads 62, 63 form positive and negative terminals or traces, respectively, for connection to the piezoelectric members 34. Bottom sides 66 of the piezoelectric members 34 are directly attached to the top side 54 of the first and second sections 48, 50 by the conductive adhesive 60. Thus, the contact pads 62 are electrically connected to the piezoelectric members 34 at different locations along the lengths of the first and second sections 48, 50 and the piezoelectric members 34. The adhesive 60 is not continuous between the piezoelectric members 34 and the flexible circuit 36 such that the positive and negative terminals formed by the contacts pads 62, 63 are electrically separate unless electricity travels through the piezoelectric members 34. Any suitable conductor trace pattern or contact pad arrangement could be provided.

The flexible circuit 36, at the location on the opposite side 56 and directly below the piezoelectric members 34, does not have any contact pads. Thus, the flexible circuit 36 in this example is not electrically connected to the metal carrier 38 directly below the piezoelectric member 34. However, in an alternate embodiment there could be a grounding connection in this location. The flexible circuit 36 in the example shown has grounding pads 64 at the ends of the first and second sections 48, 50. The grounding pads 64 are connected to the metal carriers 38 to ground the metal carriers 38 through the flexible circuit 36. The grounding pads 64 can also be used to ground other parts if desired. Conductive adhesive could be used to connect the grounding pads to the metal carriers for example. The grounding pads 64 in this example are provided on both sides 54, 56 of the flexible circuit 36.

The cushions 40 can be added to the top of the piezoelectric members 34 as a resilient spacer to help keep the top side of the piezoelectric members 34 spaced from the bottom side of the display 30. The shape of the flexible circuit 36 allows a single flexible circuit to connect to the two piezoelectric members 34, where the two piezoelectric member 34 may be located at opposite ends of the display 14. Thus, the single assembly 32 can be mounted with the display 14 as a unit to provide the piezoelectric members at opposite ends of the display 14 at a same time. This can increase the speed of assembly of the apparatus 10.

A tool, such as a jig, can be used to help assemble the assembly 32. The jig could include pins which have the tabs 46 attached thereto. One example method can comprise the jig first being used to glue the piezoelectric members 34 to the flexible circuit 36. The jig could have shelves to support the formation of the first and second section 76, 77 (see FIG. 3) of the assembly 32. The flexible circuit 36 could mounted on the pins, the adhesive located on the top side of the flexible circuit 36, and the piezoelectric members 34 could then be placed on top of the adhesive as. A top press could press the piezoelectric members 34 down. The adhesive can then be cured to permanently mechanically and electrically attach the components 36, 34 together. Once this sub-assembly is complete, the sub-assembly can be removed, the metal carriers 38 can be located on the shelves. The adhesive 58 is then placed on the top side of the metal carriers, and the sub-assembly is placed on the adhesive 58. The top press can then be used to press the sub-assembly down onto the metal carriers 38. After the adhesive 58 cures the completed assembly 32 can be removed for assembly with the apparatus 10. It should be noted that this method of assembly and tool for assembly is merely an example. Other methods and tools could be used. Usually all metal parts are grounded in a mobile telephone. This is done so the metal parts do not decrease antenna performance.

Figure 5:
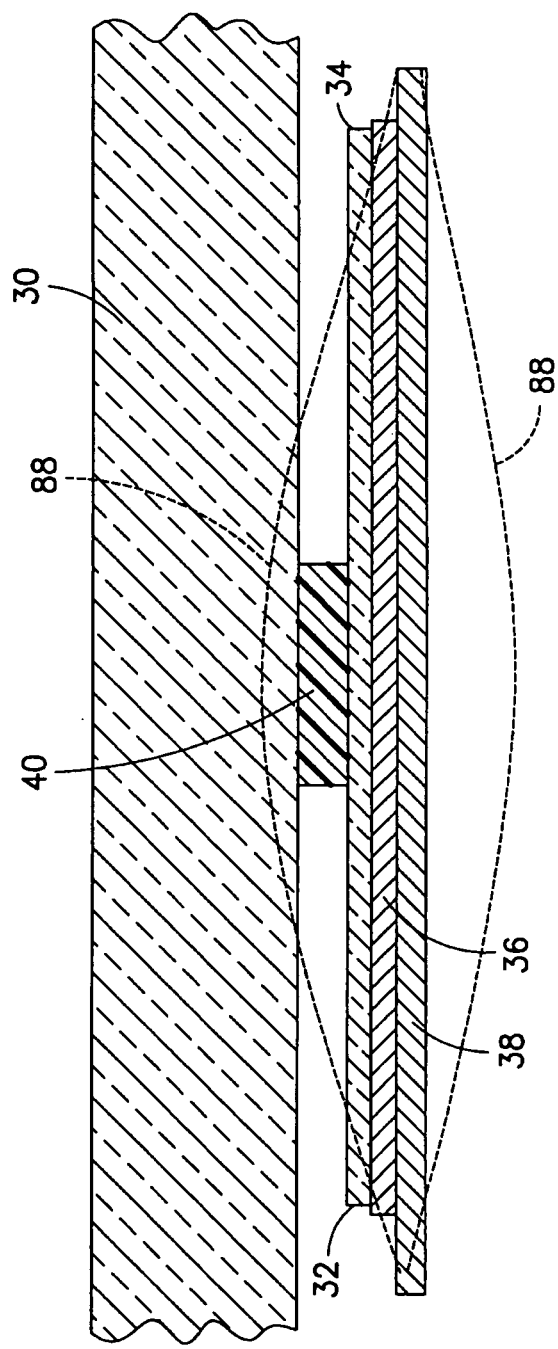
FIG. 5 is a schematic cross sectional view of the assembly shown in FIG. 3 on an electrical display.

Referring to FIG. 5, when a voltage is applied to the piezoelectric members 34 from the flexible circuit 36, the assembly 32 can deform up and down as illustrated by 88. This can be used to produce sound for feedback to the user for example.

For touch screen devices with a localized user interface (UI) feedback or a Tactile Audio Display, piezo bending actuators are usually used to generate the localized feedback on the UI or to generate sound. Those actuators are usually quite big and sometimes too big to be implemented into mobile devices. In particular, they add additional thickness to the product. The actuators must be connected electrically to the engine. Current methods of connecting such actuators add additional thickness and extra volume to the product. When piezo actuators are used as an audio source, the electrical connection should be well shielded so that no distortions can be heard by the user, such as might come from the RF module of the engine board, the display, or other sources for noises inside the device for example. New types of bending piezo actuators are usually produced with a metal carrier. This carrier should be grounded properly so that the metal carrier is not causing an interference to the RF module as floating metal. Also, piezo actuators are not a very strong component, such as made of ceramic material. Therefore, the mechanical connection implementation for a piezo actuator, especially in a hand-held apparatus, must be done in such a way that the performance of the actuator is not diminished.

An example embodiment with features described above can create a proper electrical connection including shielding (against RF noise, etc), because of proper designed copper grounding layers or silver paste layers. In addition, it is relatively easy to attach a flat section of a flexible circuit to a flat section of a rectangular piezo ceramic block. A coax cable, on the other hand, would be difficult to solder onto such a piezo actuator.

An example embodiment with features described above can insulate the piezo ceramics from the electrical connection to the metal carrier. This is because the electrical connection in the example described above connects on one side 54 of the flexible circuit to the piezo ceramics 34 with signal traces 62 (where the leads 44 are connected with a piezo amplifier at the end 90) and, the signal traces are insulated from the metal carrier on the other side of the flexible circuit. In one example, the metal carrier plate has the advantage that total thickness can be reduced to about 0.7 mm. This is less than the thickness of a 1.1 mm thickness metal carrier plate used for a FR4 piezo carrying substrate used in a conventional design. In addition, the piezos in both the conventional design and the example described above have the same performance when it comes to free displacement and blocking force.

An example embodiment with features described above can create a light electrical connection at the pads 62, 63 which does not add any additional mechanical forces onto the piezo 34; which could otherwise reduce its performance. The flexible circuit is very flexible; especially if a supper slide flex is used.

The features described above can help to reduce thickness of the whole piezo assembly. Conventional known construction is done with a 0.24 mm thick FR4 substrate between the metal carrier and the piezo ceramic. By replacing the FR4 substrate with a super slide flexible circuit, this thickness can be reduced to under 200 μm. In addition, in the area were usually the external electrical lead conductor is soldered onto the FR4 substrate, there can be a significant thickness reduction because no soldering dots are created with the flexible circuit near the piezo ceramics and the metal carriers. If the flexible circuit is done as e-flex, the connector to the main engine board can be eliminated as well. This provides even more thickness and space savings. Also, possible sources or areas for failure of the connections is eliminated. Manufacturing to provide an assembly with features described above can reduce the number of parts used to assembly the assembly, and reduce process steps. This can produce a manufacturing cost savings. Features described above can be used to reduce the risk of migration issue in high temperature and high humidity environmental conditions quite well. This is because all electrical traces 62, 63 can be encapsulated quite well.

Features described herein can provide insulate up to 60 Vpp signals conducting hardware parts quite well. There could be also use cases of voltage levels up to 250V as well.

A conventional assembly using a flexible circuit or flexible printed circuit (FPC) that is soldered or ASF bonded onto terminals of a FR4 substrate of an actuator can detach more easily than the example laminated piezo FPC described above. The conventional assembly is also more complicated to make a proper connection between a grounding layer of FPC and metal carrier. With a conventional assembly using a FR4 substrate, additional process step are also needed.

In the past, piezo actuators were electrically connected with conductive "Gore" pads which were soldered (SMD) onto a main engine board. This had a disadvantage that piezo had to be pushed with about 6N of force against the pads to achieve a sufficient enough conductivity. This additional force reduced the bending displacement of the actuator. Therefore, the performance (e.g. for localized piezo haptics) was not enough. They also had some wearing problem. Conventional soldering of cables onto the piezos is quite time consuming, and the piezo does not tolerate much heat very well. The piezo ceramics can lose polarization when heated enough (Curie temperature). It is also quite difficult to solder a round cross section wire onto a flat surface connection pad in such a small size. Soldering dots do not stick onto piezo ceramic very well. Any soldering method (to connect a cable or FPC onto a piezo ceramic) will add thickness into the connection area, and it is a source for a possible failure. POGO pin connections have a wearing issue. They are also quite big and are not shielded.

There are some piezo actuators where the metal carrier is used to connect a bi-morph piezo ceramic arrangement with each other. However, the big metal carrier plate might have an influence on antenna performance and it cannot be grounded because it connects the piezo stack on top of metal carrier with the lower piezo stack (it conducts the signal and therefore cannot be grounded).

An example embodiment connects the piezo actuators in a very efficient way (with no performance loss). It shields the driving signal properly so that it can be used in an Audio Display device. It saves thickness and space in a mobile communications device and tablet device compared to conventional designs. It makes a proper EMC design possible. None of the conventional devices solves all this issues in one very thin package. The number of interconnections (e-flex) are reduced. The number of assembly method steps are reduced. A much more robust design can be provided, and at the same times can help to reduce the total thickness and total volume for the hardware. Laminating the flexible circuit 36 into the actuator stack can also help to insulate the conducting parts and, therefore, help to decrease risk of possible short circuits and migration problems.

An alternative to the piezo FPC assembly 32 could be to design a FPC with a grounding and shielding layer (silver paste for example) which is soldered onto the FR4 pad of the piezo. This would also provide the shielding capabilities and ground of the metal carrier, but would not provide the space and thickness saving aspect of the piezo actuator stack laminated FPC.

ASF bonding can be provided between the flexible circuit 36 and piezo PZT ceramics 34 can be provided. Bonding the flexible circuit 36 with epoxy glue onto the metal carrier plate 38 can be provided. Laser etching onto a metal surface to achieve a better bond could also be used. In the case of the e-flex solution, may be the best solution in terms of volume saving. Features described herein can be used with all devices having a touch interface and/or and an audio display.

Features of an example embodiment may be provided in an apparatus 32 comprising a flexible circuit 36 comprising a flexible substrate 42 and at least one electrical conductor 44; and a least one piezoelectric member 34 adapted to move when a voltage is applied to the piezoelectric member, where the piezoelectric member is mounted to a first side 54 of the flexible substrate and electrically connected to at least one of the electrical conductors.

The at least one electrical conductor may comprise multiple contact pads 62, 63 electrically connected to the piezoelectric member at different locations along the piezoelectric member. The first side 54 of the flexible substrate may cover a majority of a side 66 of the piezoelectric member. The flexible circuit 36 may comprise at least one grounding pad 64. The flexible circuit may comprise a first section 48 which is connected to a first one of the at least one piezoelectric member, where the at least one piezoelectric member comprises a second piezoelectric member connected to a second section 50 of the flexible circuit. The flexible circuit may comprise a third section 52 between the first and second sections, where the third section comprises a connection 91 configured be connected to another member. The electrical conductors 44 have second ends 94, 95 at the end 90 for connection to the other member. Thus, the conductors 44 run as continuous conductors between their opposite ends 62, 63 and 94, 95. The apparatus may further comprise a carrier mounted to an opposite second side 56 of the flexible substrate, where a portion of the flexible circuit is sandwiched between the carrier and the piezoelectric member. The apparatus may further comprise an electrical display 30, where the at least one piezoelectric member is located between the flexible circuit and the electrical display. The first side 54 of the flexible substrate may be laminated to the piezoelectric member 34. The piezoelectric member may be connected to the flexible circuit with an electrically conductive adhesive 60. The flexible substrate may be connected to a majority of a side 66 of the piezoelectric member.

Features of an example embodiment may be provided in an apparatus 32 comprising an electrical display 30; and a user feedback system located beneath the electrical display, where the user feedback system comprises at least one piezoelectric member 34 connected to a flexible circuit 36, where the at least one piezoelectric member is located between the flexible circuit and the electrical display.

The apparatus may further comprise a foam gasket 40 between the piezoelectric member and a bottom side of the electrical display. The flexible circuit may comprise a first section 48 which is connected to a first one of the at least one piezoelectric member, and where the at least one piezoelectric member comprises a second piezoelectric member connected to a second section 50 of the flexible circuit. The flexible circuit may comprise a third section 52 between the first and second sections, where the third section comprises an end 90 configured be connected to another member. The apparatus may further comprise a metal carrier 38 mounted to the flexible substrate, where a portion of the flexible circuit is sandwiched between the metal carrier and the piezoelectric member. The flexible substrate may be laminated to the piezoelectric member. The piezoelectric member may be connected to the flexible circuit with an electrically conductive adhesive 60. The flexible substrate may be connected along a majority of a length of the piezoelectric member.

Figure 9:
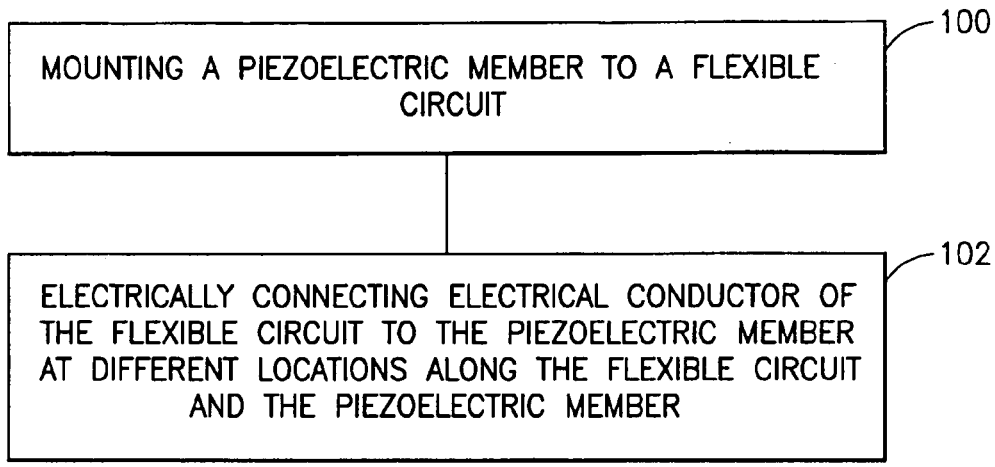
FIG. 9 is a diagram illustrating steps of an example method of assembly.

Referring also to FIG. 9, an example method may comprise mounting a side of a piezoelectric member to a side of a flexible circuit as indicated by block 100; and electrically connecting at least one electrical conductor of the flexible circuit to the piezoelectric member at different locations along the flexible circuit and the piezoelectric member as indicated by block 102. A majority of the side of the piezoelectric member may be covered by the flexible circuit.

Figure 10:
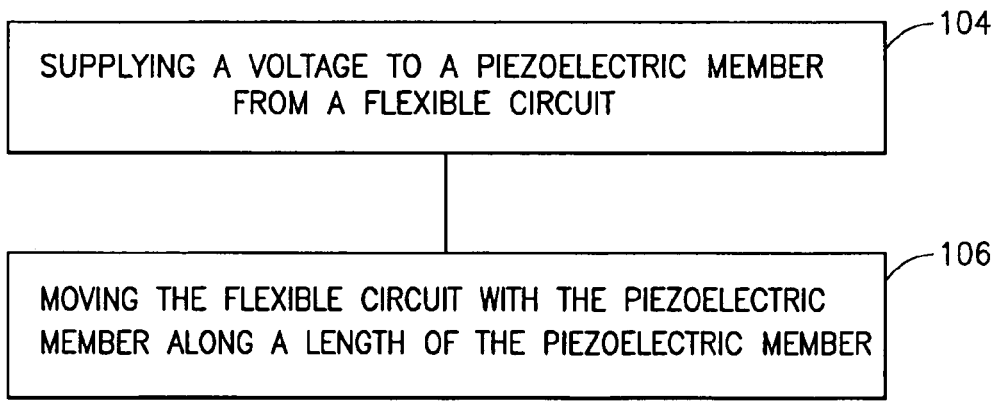
FIG. 10 is a diagram illustrating steps of an example method of use.

Referring also to FIG. 10, an example method may comprise supplying a voltage to a piezoelectric member from a flexible circuit as illustrated by block 104, where the piezoelectric member is mounted to a side of the flexible circuit; and moving the flexible circuit with the piezoelectric member along a length of the piezoelectric member as the piezoelectric member is moved by the voltage as illustrated by block 106.

Referring also to FIG. 11, the flexible circuit 36 forms an interface circuit between the piezoelectric members 34 and the circuitry 13. In particular, end 90 forms a connection to a part of the circuitry 13. In the example shown, the end 90 is connected to a printed circuit board 15 at a connection 91. Thus, an example may comprise an apparatus including an interface circuit comprising a substrate and at least one electrical conductor; and at least one piezoelectric member adapted to move when a voltage is applied to the piezoelectric member, where the piezoelectric member is mounted to a first side of the substrate and electrically connected to at least one of the electrical conductors. The interface circuit could be partially or substantially flexible. This resilient flexibility can be provided such as with a flexible printed circuit for example. The interface circuit in this example provides both electrical and mechanical interface for the piezo actuator. In this example, the circuit is directly or indirectly interfaced with the main PWB of the electronic device (i.e. the connection could be via another flex circuit and/or an adapter or connector).

Features described above may be used for an assembly and connectivity of piezo actuators suitable for Audio Display solutions. The FPC 36 may provide better shielding; there are no signals generated from any components radiating into the FPC or piezo ceramic (sometimes noise is audible via the piezos, cause also lot if distortions) as compared to inshieled cables or FPCs. The piezo FPC 32 provides proper EMI shielding due to its design.

All conductive material like metal should be grounded properly otherwise antenna performance may be reduced due to the know "floating metal" issue when parts are not grounded. Usually all metal parts are grounded in a mobile device, to not decrease antenna performance. The grounding between mechanical parts is done usually by grounding foams, etc.; f the grounding is not done via FPC or spring clips. Damping elements may be provided to hold the actuator, and those damping elements might be of non conductive material. The Piezo FPC 32 can help in this case. This invention can be used as an advantage for display audio. It can be used in other areas (e.g. to connect an Electro Active Polymere (EAP) actuators electrically). EAP actuators can work in a similar way as piezos; as actuators for haptics or audio (such as when a metal carrier is needed). Metal carriers have benefits over other materials. One can achieve quite thin structures because metals have quite high youngs-modulus. High Young modulus makes the actuator quite strong (blocking force). Features can be used for piezo buttons. This can be used with capacitive camera or volume buttons (non-mechanical ones). These can be made as "tactile" with piezo features described herein. These could be hidden under the plastic cover with an integrated capacitive touch sensor (IML molded into plastic cover). To connect those, the piezo FPC could be used because space will be an issue there as well. It can help to improve EMC situation as well.

Features may be provided in an apparatus 10 comprising an interface circuit 32 comprising a substrate and a plurality of electrical conductors 44; and at least one piezoelectric member 34 adapted to move when a voltage is applied to the piezoelectric member. The piezoelectric member 34 is mounted to a first side 54 of the substrate 42, where each of the electrical conductors has a first end 62, 63 and a second end 94, 95, where the first ends are connected to the at least one piezoelectric member directly between the substrate 42 and the at least one piezoelectric member 34, and where the electrical conductors 44 extend away from the at least one piezoelectric member 34 such that the second ends 94, 95 of the electrical conductors are spaced a substantial distance away from the at least one piezoelectric member for connection to another component. The substantial distance, as illustrated in FIGS. 3, 4 and 7 is merely a distance spaced away from the sections 76, 77.

As illustrated in FIGS. 3 and 4, in this example the substantial distance comprises the second ends at the end 90 being located in a different plane than the first ends 62, 63. "Substantial distance" is intended to mean a distance spaced from, and not adjacent to, the piezoelectric members 34. In the example shown, the distance is more than a width of the piezoelectric members. The substantial distance may merely comprise the first and second ends of the conductors being separated by a physical distance wherein the second end is positioned away from the section carrying the piezo member. The conductors 44 in the example shown extend away from the metal carriers 38 to the second ends 94, 95 at the connection end 90. The first section 76 (see FIG. 3) and section 52 at connection end 90 are spaced from each other, and at least some of the electrical conductors 44 have their first ends 62, 63 at the first section 76 sandwiched between 34 and 36, and an opposite second end at 90. With the example shown, no soldered connection near the piezoelectric members is needed. The conductors 44 of the flex circuit 36 form the electrodes for the piezoelectric member 34 (such as their first end 62, 63) which stay under the bottom surface area 66 of the piezo actuators, which is another reason this design provides good shielding. The voltage is applied directly to the piezo actuator from the same member (the member 36) connected to the other component at connection 91. No intermediate electrical connections of electrodes to conductors is needed near the sections 76, 77. The conductors 44 are merely connected to the piezoelectric members 34 directly under the members 34, and then the conductors 44 extend to the spaced connection end 90 without any additional intermediate electrical connections between the ends 62, 63 and 94, 95.

The electrical conductors 44 may comprise multiple contact pads 62, 63 electrically connected to the piezoelectric member 34 at different locations along the piezoelectric member. The first side 54 of the flexible substrate 36 may cover a majority of a side 66 of the piezoelectric member. The substrate 42 comprises a flexible polymer material such that the substrate and electrical conductors are a flexible circuit. The flexible circuit may comprise at least one grounding pad. The interface circuit 36 may comprise a first section 48 which is connected to a first one of the at least one piezoelectric member, where the at least one piezoelectric member comprises a second piezoelectric member connected to a second section 50 of the interface circuit. The interface circuit 36 may comprise a third section 52 between the first and second sections, where the third section comprises a connection 91 comprising the second ends 94, 95 of the electrical conductors 44 which is configured be connected to the another component 15. The apparatus may further comprise a carrier 38 mounted to an opposite second side 56 of the interface substrate 36, where a portion of the interface circuit is sandwiched between the carrier 38 and the piezoelectric member 34. The apparatus may further comprise an electrical display 30, where the at least one piezoelectric member 34 is sandwiched between the interface circuit 36 and the electrical display 30. The first side 54 of the interface substrate 36 may be laminated to the piezoelectric member 34. The piezoelectric member 34 may be connected to the interface circuit 36 with an electrically conductive adhesive 60. The interface substrate 36 may be connected to a majority of a side of the piezoelectric member 36. The another component may comprises a main printed wiring board 15 of the apparatus 10, and the second ends 94, 95 of the conductors 44 may be directly connected to the main printed wiring board 15. In one type of alternate embodiment, the interface circuit may comprise more than one member, such as multiple flex circuits 36 or the flex circuit 36 and one or more additional members.

In one example, an apparatus comprises an electrical display 30; and a user feedback system located beneath the electrical display, where the user feedback system comprises at least one piezoelectric member 34 connected to a flexible circuit 36, where the flexible circuit comprises a flexible polymer substrate 42 and electrical conductors 44 on the flexible polymer substrate, where the at least one piezoelectric member 34 is sandwiched between the flexible circuit 36 and the electrical display 30.

The apparatus may further comprise a foam gasket 40 between the piezoelectric member 34 and a bottom side of the electrical display 30. The flexible circuit 36 may comprise a first section 48 which is connected to a first one of the at least one piezoelectric member 34, and the at least one piezoelectric member may comprises a second piezoelectric member 34 connected to a second section 50 of the flexible circuit. The flexible circuit 36 may comprise a third section 52 between the first and second sections, where the third section comprises an end configured be connected to another member 15. The apparatus may further comprise a metal carrier 38 mounted to the flexible substrate 36, where a portion of the flexible circuit is sandwiched between the metal carrier and the piezoelectric member 34. The flexible substrate 36 may be laminated to the piezoelectric member 34. The piezoelectric member 34 may be connected to the flexible circuit 36 with an electrically conductive adhesive 60. The flexible substrate 36 may be connected along a majority of a length of the piezoelectric member 34.

One example method comprises mounting a side 66 of a piezoelectric member 34 to a side 54 of a flexible circuit 36, where the flexible circuit comprises a substrate 42 and electrical conductors 44, where the substrate 42 comprises a flexible polymer material; and electrically connecting the electrical conductors 44 of the flexible circuit 36 to the piezoelectric member 34 at different locations along the flexible circuit and the piezoelectric member. A majority of the side 66 of the piezoelectric member 34 may be covered by the flexible circuit 36.

Another example method may comprise supplying a voltage to a piezoelectric member 34 from a flexible circuit 36, where the flexible circuit comprises an electrical insulating flexible substrate 42 and electrical conductors 44, where the substrate 42 comprises a flexible polymer material, and where the piezoelectric member 34 is mounted to a side 54 of the flexible substrate with contact pads 62, 63 of the electrical conductors being sandwiched between portions of the flexible polymer material 42 and the piezoelectric member 34; and moving the flexible circuit with the piezoelectric member along a length of the piezoelectric member as the piezoelectric member is moved by the voltage.

Referring also to FIG. 12, the piezo assembly may be assembled with the display 30 in a different organization. Comparing FIG. 12 to FIG. 5, the assembly is reversed. In FIG. 5, the piezo ceramic 34 is connected with a foam gasket 40 onto the display 30. In FIG. 12, the piezo ceramic 34 is at the bottom, then comes the FPC 36, then the metal carrier 38, and onto the metal carrier 38 there is a foam gasket 40 attached which connects carrier plate 38 and display 30. Thus, this illustrates that different organizations of the elements could be provided. Similar to the example shown in FIG. 5, the FPC 36, piezoelectric member 34 and display 30 are still in a sandwiched or stacked configuration. The example shown in FIG. 12 merely has both the cushion 40 and metal carrier 38 also in that sandwiched or stacked configuration. But the metal carrier 38 is located inside the sandwiched or stacked configuration in the example shown in FIG. 12.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
    an interface circuit comprising a substrate and a plurality of electrical conductors;
    at least one piezoelectric member adapted to move when a voltage is applied to the piezoelectric member, where the at least one piezoelectric member is mounted to a first side of the substrate, where each of the electrical conductors has a first end and a second end, where the first ends are connected to the at least one piezoelectric member between the substrate and the at least one piezoelectric member, and where the electrical conductors extend away from the at least one piezoelectric member such that the second ends of the electrical conductors are spaced a substantial distance away from the first ends for connection to another component, where the first ends of the electrical conductors are in a different plane than the second ends of the electrical conductors; and
    a metal carrier mounted to an opposite second side of the substrate, where a portion of the interface circuit including the substrate is located between the metal carrier and the at least one piezoelectric member, where at least one of the electrical conductors of the interface circuit is electrically connected to the metal carrier for the metal carrier to be connected to a ground through the interface circuit when the second ends are connected to the another component, and where the substrate provides electrical insulation of the metal carrier from the at least one piezoelectric member,
    where the apparatus is configured to be positioned at a display, with the at least one piezoelectric member being located between the display and the metal carrier, such that the apparatus is configured to move the display when the voltage is applied to the at least one piezoelectric member, where the substrate comprises a flexible polymer material such that the substrate and electrical conductors are a flexible circuit, and where the flexible circuit comprises at least one grounding pad, where the at least one ground pad is configured to flex with the substrate.

2. An apparatus as in claim 1 where the interface circuit comprises a first section which is connected to a first one of the at least one piezoelectric member, where the at least one piezoelectric member comprises a second piezoelectric member connected to a second section of the interface circuit.

3. An apparatus as in claim 2 where the interface circuit comprises a third section between the first and second sections, where the third section comprises a connection comprising the second ends of the electrical conductors which is configured be connected to the another component.

4. An apparatus as in claim 1 further comprising an electrical display provided as the display, where the at least one piezoelectric member is located between the interface circuit and the electrical display.

5. An apparatus as in claim 1 where the first side of the substrate is laminated to the piezoelectric member.

6. An apparatus as in claim 1 where the piezoelectric member is connected to the interface circuit with an electrically conductive adhesive.

7. An apparatus as in claim 1 where the another component comprises a main printed wiring board of the apparatus, and where the second ends of the conductors are directly or indirectly connected to the main printed wiring board.

8. An apparatus as in claim 1 further comprising an electrical display provided as the display, electrical circuitry comprising at least one printed wiring board, at least one processor, at least one memory, a receiver and a transmitter, and a battery, where the at least one printed wiring board comprises the another member, where a connection of the interface circuit to the at least one printed wiring board connects the metal carrier to the ground, and where the at least one piezoelectric member is connected directly or indirectly to the electrical display.

9. An apparatus as in claim 1 where the metal carrier is a first metal carrier of the apparatus, where the apparatus comprises a second metal carrier connected to the interface circuit spaced from the first metal carrier, and where the at least one piezoelectric member comprises a first piezoelectric member at the first metal carrier and a second piezoelectric member at the second metal carrier, where the interface circuit mechanically connects the first piezoelectric member and first metal carrier to the second piezoelectric member and second metal carrier.

10. An apparatus as in claim 1 where the metal carrier is smaller than the substrate.

11. An apparatus as in claim 1 where a side of the metal carrier is located against the substrate along a majority of a length of the side of the metal carrier.

12. An apparatus comprising:
    an electrical display;
    a user feedback system located beneath the electrical display, where the user feedback system comprises at least one piezoelectric member connected to a flexible circuit, where the flexible circuit comprises a flexible polymer substrate, a plurality of electrical conductors on the flexible polymer substrate and at least one grounding pad, where the at least one ground pad is configured to flex with the flexible polymer substrate, where the at least one piezoelectric member is in a sandwich configuration with the flexible circuit and the electrical display, where at least two of the electrical conductors comprise first ends connected to the at least one piezoelectric member and spaced second ends, where the second ends are located in a different plane than the first ends; and
    a metal carrier mounted to the flexible polymer substrate, where a portion of the flexible circuit including the flexible polymer substrate is located between the metal carrier and the at least one piezoelectric member, where the at least one grounding pad of the flexible circuit is electrically connected to the metal carrier to allow the metal carrier to be connected a ground through the flexible circuit when the second ends are connected to another member, and where the flexible polymer substrate provides electrical insulation between the metal carrier and the at least one piezoelectric member,
    where the user feedback system is located relative to the electrical display to move the electrical display when the at least one piezoelectric member is actuated.

13. An apparatus as in claim 12 further comprising a foam gasket between the at least one piezoelectric member and a bottom side of the electrical display.

14. An apparatus as in claim 12 where the flexible circuit comprises a first section which is connected to a first one of the at least one piezoelectric member, and where the at least one piezoelectric member comprises a second piezoelectric member connected to a second section of the flexible circuit.

15. An apparatus as in claim 14 where the flexible circuit comprises a third section between the first and second sections, where the third section comprises an end configured be connected to the another member.

16. An apparatus as in claim 12 where the flexible polymer substrate is laminated to the at least one piezoelectric member.

17. An apparatus as in claim 12 where the metal carrier is a first metal carrier of the apparatus, where the apparatus comprises a second metal carrier connected to the flexible polymer substrate spaced from the first metal carrier, and where the at least one piezoelectric member comprises a first piezoelectric member at the first metal carrier and a second piezoelectric member at the second metal carrier, where the flexible circuit mechanically connects the first piezoelectric member and first metal carrier to the second piezoelectric member and second metal carrier.

18. An apparatus as in claim 12 where the metal carrier is smaller than the flexible polymer substrate.

19. A method comprising:
mounting a side of a piezoelectric member to a first side of a flexible circuit, where the flexible circuit comprises a substrate, a plurality of electrical conductors and at least one grounding pad, where the substrate comprises a flexible polymer material, where the at least one ground pad is configured to flex with the substrate;
electrically connecting first ends of at least two of the electrical conductors of the flexible circuit to the piezoelectric member at different locations along the flexible circuit and the piezoelectric member, where the at least two electrical conductors comprise second ends spaced from the first ends, where the second ends are located in a different plane relative to the first ends; and
mounting a side of a flexible metal carrier to an opposite second side of the flexible circuit, where a portion of the flexible circuit including the substrate is located between the piezoelectric member and the metal carrier, where the at least one grounding pad of the flexible circuit is electrically connected to the metal carrier to allow the metal carrier to be connected a ground through the flexible circuit when the second ends are connected to another component, and where the substrate of the flexible circuit provides electrical insulation between the metal carrier and the piezoelectric member, where the flexible metal carrier is smaller than the substrate of the flexible circuit, and where a majority of a length of the side of the flexible metal carrier is located against the second side of the flexible circuit.

20. A method as in claim 19 where a majority of the side of the at least one piezoelectric member is covered by the flexible circuit.

21. A method comprising:
supplying a voltage to a piezoelectric member from a flexible circuit, where the flexible circuit comprises an electrical insulating flexible substrate, electrical conductors and at least one grounding pad, where the flexible substrate comprises a flexible polymer material, where the at least one ground pad is configured to flex with the flexible substrate, and where the piezoelectric member is mounted to a first side of the flexible substrate with first ends of the electrical conductors being located between portions of the flexible polymer material and the piezoelectric member, where the electrical conductors comprise second ends which are spaced from the first ends, where the second ends are located in a different plane relative to the first ends, where a flexible metal carrier is attached to an opposite second side of the flexible substrate with the flexible substrate providing electrical insulation between the metal carrier and the piezoelectric member, where the at least one grounding pad of the flexible circuit is electrically connected to the metal carrier to connect the metal carrier to a ground through the flexible circuit when the second ends are connected to another component, and where the flexible substrate provides electrical insulation between the metal carrier and the piezoelectric member;
moving the flexible circuit and the metal carrier with the piezoelectric member along a length of the piezoelectric member as the piezoelectric member is moved by the voltage; and
the piezoelectric member moving an electrical display when the of the piezoelectric member is moved.

* * * * *